United States Patent

Kojima

[11] Patent Number: 5,886,357
[45] Date of Patent: Mar. 23, 1999

[54] ELECTRON-BEAM WRITING SYSTEM COMPRISING A SECOND APERTURE MEMBER INCLUDING AT LEAST ONE RECTANGULAR BEAM-SIZE ADJUSTMENT APERTURE

[75] Inventor: Yoshikatsu Kojima, Tokyo, Japan

[73] Assignee: NEC Corporation, Tokyo, Japan

[21] Appl. No.: 924,102

[22] Filed: Sep. 5, 1997

[30] Foreign Application Priority Data

Sep. 6, 1996 [JP] Japan .................................. 8-236220

[51] Int. Cl.$^6$ .................................................. H01J 37/302
[52] U.S. Cl. ...................................... 250/452.23; 250/397
[58] Field of Search .............................. 250/492.2, 491.1, 250/492.23, 397

[56] References Cited

U.S. PATENT DOCUMENTS

| | | | |
|---|---|---|---|
| 5,404,019 | 4/1995 | Ohno et al. | 250/397 |
| 5,438,207 | 8/1995 | Itoh et al. | 250/492.23 |
| 5,468,969 | 11/1995 | Itoh et al. | 250/492.23 |
| 5,712,488 | 1/1998 | Stickel et al. | 250/492.23 |

OTHER PUBLICATIONS

Y. Nakayama, et al., "Electron–beam cell projection lithography: A new high–throughput electron–beam direct–writing technology using a specially tailored Si aperture", J. Vac. Sci. Technol. B., vol. 8, No. 6, Nov./Dec. 1990, pp. 1836–1940.

*Primary Examiner*—Bruce Anderson
*Attorney, Agent, or Firm*—Whitham, Curtis & Whitham

[57] ABSTRACT

In an electron-beam writing system comprising an electron gun for radiating an original electron beam along an electron gun axis, a first aperture member for shaping the original electron beam into a primary shaped electron beam, and deflecting means for deflecting the primary shaped electron beam from the electron gun axis to produce a deflected electron beam, and a second aperture member for shaping the first deflected electron beam into a secondary shaped electron beam, the second aperture member has a plurality of secondary apertures which include at least one rectangular beam-size adjustment aperture having a known design size. The secondary apertures may include a plurality of rectangular beam-size adjustment apertures having longitudinal and lateral dimensions either which vary at a constant ratio.

11 Claims, 5 Drawing Sheets

ELECTRON-BEAM WRITING SYSTEM COMPRISING A SECOND APERTURE MEMBER INCLUDING AT LEAST ONE RECTANGULAR BEAM-SIZE ADJUSTMENT APERTURE

BACKGROUND OF THE INVENTION

This invention relates to an electron-beam writing system in lithography technique for large-scale integration (LSI) manufacturing and, more particularly, to a method of a beam size of an electron beam on writing a pattern on a sample by an electron-beam exposure of an electron-beam cell projection lithography.

In recent years, a design rule of ultra-large-scale integration (ULSI) or the minimum line width keeps on miniaturizing. It is therefore difficult to manufacture the ULSI by a conventional reduction projection exposure using ultraviolet light. In order to resolve problems in miniaturization of patterns, electron-beam (EB) direct writing technology is used for fabricating the ULSI.

However, inasmuch as the electron-beam direct writing technology carries out exposure of the pattern using a focused electron beam with one stroke, the electron-beam direct writing technology is disadvantageous in that it has poor throughput compared with that of the reduction projection exposure.

As a method of resolving the above-mentioned disadvantage, an electron-beam writing system of an electron-beam (EB) cell projection lithography is developed in resent years. Such electron-beam (EB) cell projection lithography is disclosed in, for example, an article which is contributed by Y. Nakayama et al. to J. Vac. Sci. Thechnol. B, Vol. 8, No. 6, (Nov/Dec 1990), pages 1836–1840, and which has a title of "Electron-beam cell projection lithography: A new high-throughput electron-beam direct-writing technology using a specially tailored Si aperture."

In the manner which will later be described in conjunction with FIG. 1, a conventional electron-beam writing system comprises an electron gun, a first aperture member having a primary aperture, a first deflecting arrangement consisting of a shape deflector and a selection deflector, a second aperture member having a plurality of secondary apertures, a reduction lens, and a second deflecting arrangement. The electron gun radiates an original electron beam along an electron gun axis. The first aperture member shapes the original electron beam into a primary shaped electron beam. The first deflecting arrangement deflects the primary shaped electron beam from the electron gun axis to produce a first deflected electron beam. The second aperture member shapes the first deflected electron beam into a secondary shaped electron beam. The second aperture member has, as the secondary apertures, a variable-shaped aperture for a variable-shaped electron-beam exposure and a plurality of cell projection apertures for the EB cell projection lithography. The reduction lens reduces the secondary shaped electron beam to produce a reduced electron beam. The second deflecting arrangement deflects the reduced electron beam to produce a second deflected electron beam which is irradiated on a sample.

In the variable-shaped electron-beam exposure, the shape deflector is used and the first deflected electron beam is irradiated on the variable-shaped aperture of the second aperture member. In this event, the secondary shaped electron beam shaped by the variable-shaped aperture is called a variable-shaped electron beam. In the EB cell projection lithography, the selection deflector and the first deflected electron beam is irradiated on a selected one of the cell projection apertures of the second aperture member. In this event, the secondary shaped electron beam shaped by the selected one of the cell projection apertures is called a cell projected electron beam.

In practical EB cell projection lithography, repetitious patterns are exposed using the EB cell projection lithography which nonrepetitious or random patterns touching the repetitious patterns are exposed using the variable-shaped electron-beam exposure. As a result, the repetitious patterns and the random pattern border each other at boundary sections. It is possible in the variable-shaped electron-beam exposure to make an adjustment of a beam size of the variable-shaped electron beam by using a reference mark formed on a stage. However, it is difficult in the EB cell projection lithography to correctly measure the beam size of the cell projected electron beam. As a result, in the boundary sections, size differences of the patterns formed by differences of the both beam sizes between the variable-shaped electron beam and the cell projected electron beam occur. Accordingly, the conventional electron-beam writing system is disadvantageous in that it causes degradation of reliability on fabrication of a device.

SUMMARY OF THE INVENTION

It is therefore an object of this invention to provide an electron-beam writing system which is capable of reducing size differences between a pattern by variable-shaped electron-beam exposure and a pattern by EB cell projection lithography.

It is another object of this invention to provide a beam-size adjusting method which is capable of preventing degradation of pattern size precision.

Other objects of this invention will become clear as the description proceeds.

According to an aspect of this invention, an electron-beam writing system comprises an electron gun for radiating an original electron beam along an electron gun axis. A first aperture member has a primary aperture on which the original electron beam is irradiated. The first aperture member shapes the original electron beam into a primary shaped electron beam. A first deflecting arrangement deflects the primary shaped electron beam from the electron gun axis to produce a first deflected electron beam. A second aperture member has a plurality of secondary apertures on a selected one of which the first deflected beam is irradiated. The second aperture member shapes the first deflected electron beam into a secondary shaped electron beam. The secondary apertures includes at least one rectangular beam-size adjustment aperture having a known design size. A reduction lens reduces the secondary shaped electron beam to produce a reduced electron beam. A second deflecting arrangement deflects the reduced electron beam to produce a second deflected electron beam which is irradiated on a sample.

According to another aspect of this invention, a second aperture member is for use in an electron-beam writing system comprising an electron gun for radiating an original electron beam along an electron gun axis, a first aperture member having a primary aperture on which the original electron beam is irradiated. The first aperture member shapes the original electron beam into a primary shaped electron beam. A deflecting arrangement deflects the primary shaped electron beam from the electron gun axis to produce a deflected electron beam. The second aperture member has a plurality of secondary apertures on a selected one of which the deflected beam is irradiated. The second aperture member shapes the first deflected electron beam into a secondary shaped electron beam. The secondary apertures include at least one rectangular beam-size adjustment aperture having a known design size.

According to still another aspect of this invention, a beam size adjusting method adjusts a variable-shaped beam size for a variable-shaped electron beam passing through a variable-shaped aperture formed in a second aperture member for use in an electron-beam writing system. The second aperture member includes at least one rectangular beam-size adjustment aperture having a known design size. The beam-size adjusting method comprises the steps of measuring a beam size of an electron beam passing through the rectangular beam-size adjustment aperture to obtain a measured beam size, calculating a difference between the measured beam size and the design size, and adding the difference to the variable-shaped beam size.

DESCRIPTION OF THE PREFERRED EMBODIMENTS

Figure 1:
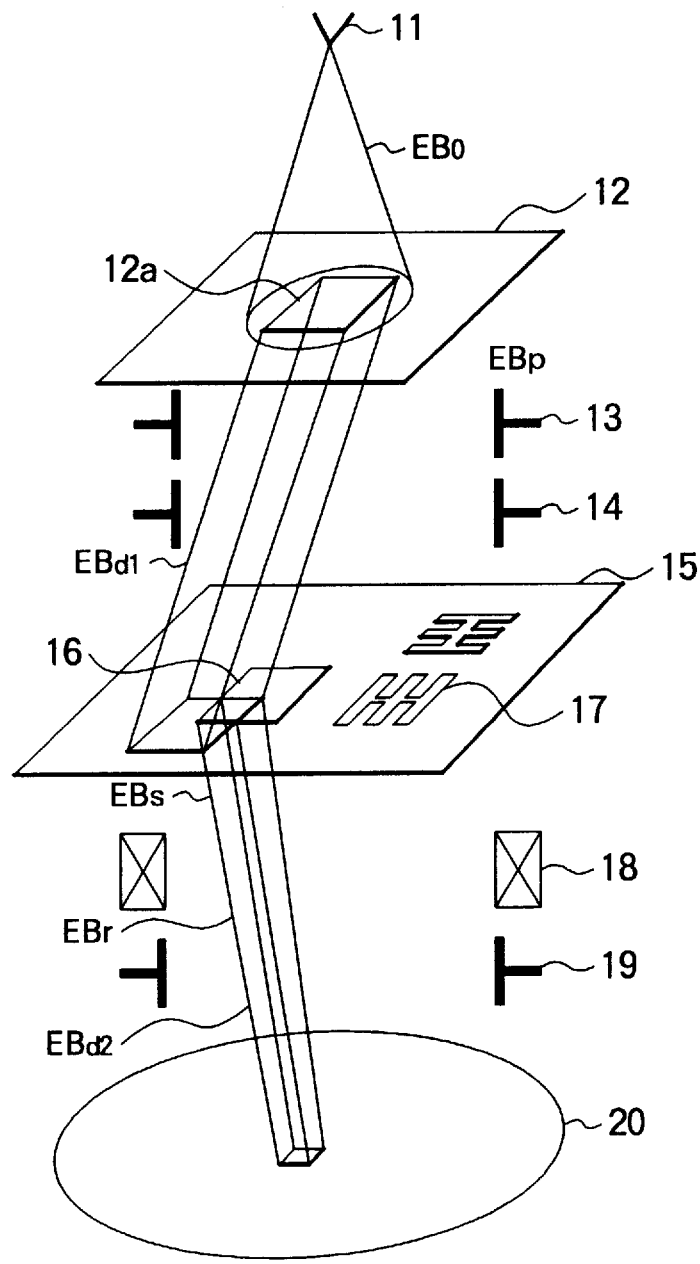
FIG. 1 is a schematic vertical sectional perspective view of a conventional electron-beam writing system.

Referring to FIG. 1, a conventional electron-beam (EB) writing system will be described at first in order to facilitate an understanding of the present invention. The illustrated electron-beam writing system realizes EB cell projection lithography. The electron-beam writing system comprises an electron gun 11. The electron gun 11 has an electron gun axis. The electron gun 11 is for radiating an original electron beam $EB_o$ along the electron gun axis. The original electron beam $EB_o$ is irradiated on a first aperture member 12 which has a primary aperture 12a. The primary aperture 12a is a rectangular aperture. The first aperture member 12 shapes the original electron beam EBo into a primary shaped electron beam $EB_p$. Inasmuch as the primary aperture 12a is the rectangular aperture, the primary shaped electron beam $EB_p$ is a rectangular shaped electron beam, as shown in FIG. 1.

The primary shaped electron beam $EB_p$ enters a first deflecting arrangement which comprises a shape deflector 13 and a selection deflector 14. The first deflecting arrangement is for deflecting the primary shaped electron beam $EB_p$ from the electron gun axis to produce a first deflected electron beam $EB_{d1}$. The first deflected electron beam $EB_{d1}$ is irradiated on a second aperture member 15. The second aperture member 15 has a plurality of secondary apertures as will presently be described. The second aperture member 15 shapes the first deflected electron beam EBd1 into a secondary shaped electron beam $EB_s$. The secondary apertures comprise a variable-shaped aperture 16 and a plurality of cell projection apertures 17. The variable-shaped aperture 16 is for use in a variable-shaped electron-beam exposure. The illustrated variable-shaped aperture 16 is a rectangular aperture. The cell projection apertures 17 are for use in EB cell projection lithography. Each cell projection aperture 17 has a shape corresponding to a part which is extracted from an exposure pattern.

The secondary shaped electron beam $EB_s$ enters a reduction lens 18. The reduction lens 18 reduces the secondary shaped electron beam $EB_s$ to produce a reduced electron beam $EB_r$. The reduced electron beam $EB_r$ enters a second deflecting arrangement which consists of a deflector 19. The second deflecting arrangement is for deflecting the reduced electron beam $EB_r$ to produce a second deflected electron beam $EB_{d2}$. The second deflected electron beam $EB_{d2}$ is irradiated on a sample such as a wafer 20 at an arbitrary point.

Description will be made about operation of the conventional electron-beam writing system illustrated in FIG. 1. Description will proceed at first to an operation in a case where the variable-shaped electron-beam exposure is carried out. Thereafter, description will proceed to another operation in another case where the EB cell projection lithography is carried out.

In the variable-shaped electron-beam exposure, the original electron beam $EB_o$ radiated by the electron gun 11 is shaped into the primary or the rectangular shaped electron beam $EB_p$ by the first aperture member 12. Thereafter, the primary shaped electron beam $EB_p$ is deflected by the shape deflector 13 into the first deflected electron beam $EB_{d1}$ which is irradiated on the variable-shaped aperture 16 of the second aperture member 15, as shown in FIG. 1. Accordingly, the primary shaped electron beam $EB_p$ is shaped into the secondary shaped electron beam $EB_s$ having a beam size where the primary aperture 12a overlaps with the variable-shaped aperture 16. Such a secondary shaped electron beam $EB_s$ is called a variable-shaped electron beam. The secondary shaped electron beam $EB_s$ is reduced into the reduced electron beam $EB_r$ by the reduction lens and then the reduced electron beam $EB_r$ deflected by the deflector 19 into the second deflected electron beam $EB_{d2}$ which is irradiated on the wafer 20 at the arbitrary point.

In the EB cell projection lithography, the primary shaped electron beam $EB_p$ from the first aperture member 12 is deflected by the selection deflector 14 into the first deflected electron beam $EB_{d1}$ which is irradiated on a selected one of the cell projection apertures 17 of the second aperture member 15. Accordingly, the first deflected electron beam $EB_{d1}$ is shaped into the secondary shaped electron beam $EB_s$ having a shape of the selected one of the cell projection apertures 17. Such a secondary shaped electron beam $EB_s$ is called a cell projected electron beam. Thereafter, the secondary shaped electron beam $EB_s$ is reduced into the reduced electron beam $EB_r$ by the reduction lens and then the reduced electron beam $EB_r$ is deflected by the deflector 19 into which is the second deflected electron beam $EB_{d2}$ irradiated on the wafer 20 at the arbitrary point.

As a result, in the EB cell projection lithography, it is possible to reduce the shot number in comparison with the variable-shaped electron-beam exposure by preliminarily forming the cell projection apertures 17 having complicated patterns on the second aperture member 15 and to achieve higher throughput. Such an electron-beam cell projection lithography is disclosed in, for example, an article which is contributed by Y. Nakayama et al. to J. Vac. Sci. Thechnol. B, Vol. 8, No. 6, (Nov/Dec 1990), pages 1836–1840, and which has a title of "Electron-beam cell projection lithography: A new high-throughput electron-beam direct-writing technology using a specially tailored Si aperture."

In practical EB cell projection lithography, it is impossible to replace all patterns with cell projection apertures. This is because there is restriction in an area where the cell projection apertures 17 are formed and the number of the cell projection apertures 17 formed on the second aperture member 15. As a result, the cell projection apertures 17 are cut into the second aperture member 15 by preliminarily extracting only a part from all patterns that comprises repetitious patterns. In addition, the repetitious patterns are exposed using the EB cell projection lithography while nonrepetitious or random patterns touching the repetitious patterns are exposed using the variable-shaped electron-beam exposure.

As described above, in a case where the exposure is carried out using the EB cell projection lithography, the repetitious patterns in the exposure pattern are exposed using the EB cell projection lithography while the random patterns are exposed using the variable-shaped electron-beam exposure. As a result, the repetitious patterns and the random patterns border each other at boundary sections.

It is possible in the variable-shaped electron-beam exposure to make an adjustment of a beam size of the variable-shaped electron beam by using a reference mark formed on a stage. Accordingly, it is possible to always maintain a correct beam size of the variable-shaped electron beam by making the adjustment of the beam size of the electron beam although the beam size of the electron beam changes in dependency on fluctuations of a linearity of the shape deflector 13, a beam reduction ratio of the reduction lens 18, and so on.

On the other hand, inasmuch as the patterns are preliminarily formed on the second aperture member 15 as the cell projection apertures 17 in the EB cell projection lithography, a case where a correct beam size having a designed value is not obtained on the wafer 20 occurs because of a forming precision on forming the cell projection apertures 17, fluctuation of a beam reduction ratio, and so on. It is difficult to correctly measure the beam size of the cell projected electron beam. This is because the cell projected electron beam has a complicated pattern shape. As a result, in the boundary sections between the random patterns due to the variable-shaped electron-beam exposure and the repetitious patterns due to the EB cell projection lithography, size differences of the patterns formed by differences of the both beam sizes between the variable-shaped electron beam and the cell projected electron beam occur. Accordingly, the conventional electron-beam writing system is disadvantageous in that it causes degradation of reliability on fabrication of a device, as mentioned in the preamble of the instant specification.

Figure 2:
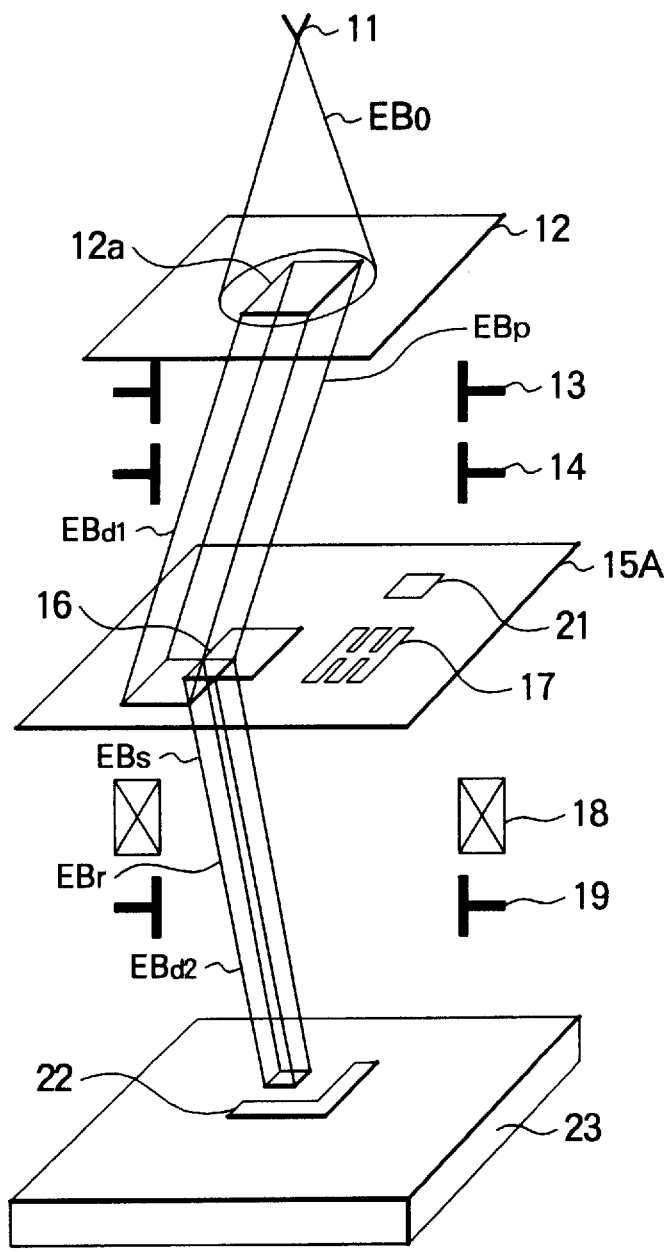
FIG. 2 is a schematic vertical sectional perspective view of an electron-beam writing system according to a first embodiment of this invention.
Figure 3:
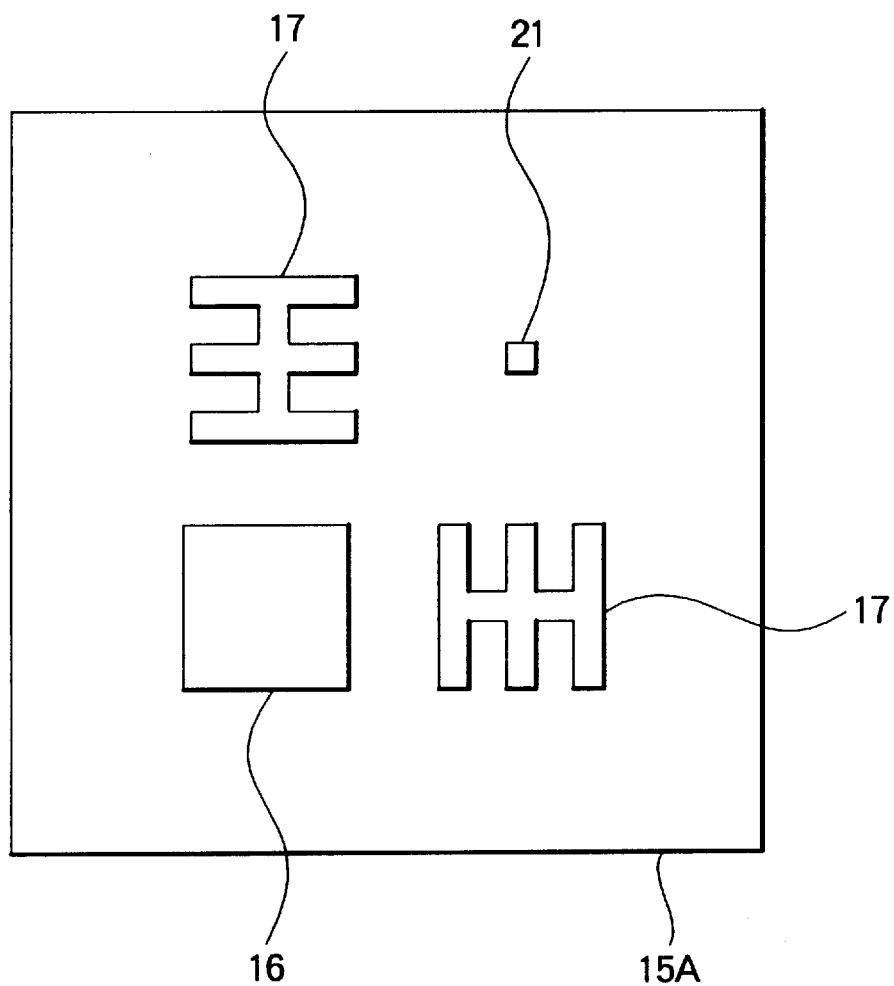
FIG. 3 is a plan view of a second aperture member for use in the electron-beam writing system illustrated in FIG. 2.

Referring to FIGS. 2 and 3, an electron-beam writing system according to a first embodiment of this invention comprises similar parts designated by like reference numerals in those illustrated in FIG. 1. Like in FIG. 1, the illustrated electron-beam writing system comprises the electron gun 11, the first aperture member 12, the shape deflector 13, the selection deflector 14, a second aperture member 15A, the reduction lens 18, and the deflector 19. In the example being illustrated, the second aperture member 15A is similar in structure to the second aperture member 15A illustrated in FIG. 1 except that the second aperture member 15 has a beam-size adjustment aperture 21 as well as the variable-shaped aperture 16 and the cell projection apertures 17.

In the example being illustrated, the beam-size adjustment aperture 21 is a square aperture having design dimensions of twenty-five microns by twenty-five microns.

Description will now proceed to adjustment of the beam size. It will be assumed as follows. The primary aperture 12a in the first aperture member 12 is a square aperture of 130 $\mu$m□. The variable-shaped aperture 16 in the second aperture member 15A is a square aperture of 125 $\mu$m□. The reduction lens 18 has a reduction rate of ⅟₂₅.

At first, the adjustment of the beam size in the variable-shaped electron beam is carried out. More specifically, the original electron beam $EB_o$ radiated by the electron gun 11 is shaped into the primary shaped electron beam $EB_p$ having a square shape of 130 $\mu$m□ by the first aperture member 12. Thereafter, the primary shaped electron beam $EB_p$ is deflected by the shape deflector 13 into the first deflected electron beam $EB_{d1}$ which is irradiated on the variable-shaped aperture 16 of 125 $\mu$m□ in the second aperture member 15A. At any rate, the primary shaped electron beam $EB_0$ is shaped by the second aperture member 15A into the secondary shaped electron beam $EB_s$ of the variable-shaped electron beam.

The secondary shaped electron beam $EB_s$ passing through the variable-shaped aperture 16 is reduced by the reduction lens 18 into the reduced electron beam $EB_r$ having a size which is one twenty-fifths of that of the second shaped electron beam $EB_s$. The reduced electron beam $EB_r$ is defleced by the deflector 19 into the second deflected electron beam $EB_{d2}$ which scans a reference mark 22 on a stage 23 as the sample. The reference mark 22 reflects the second deflected electron beam $EB_{d2}$ as a reflected electron signal. It is possible to calculate the beam size for the variable-shaped electron beam on the basis of the reflected electron signal.

The above-mentioned operation is repeatedly carried out with respect to a plurality of beam sizes. A deflection amount of the shape deflector 13 is adjusted so as to eliminate a difference between a set beam size and a measured beam size. More specifically, the beam size on the reference mark 22 is changed with respect to length and breadth from one micron to five microns by one micron and the adjustment of the beam size in the variable-shaped electron beam is carried out.

Subsequently, measurement is made as regard the beam size of the electron beam passing through the beam-size adjustment aperture 21. More specifically, the primary shaped electron beam $EB_p$ having the rectangular size shaped by the first aperture member 12 is deflected by the selection deflector 14 into the first deflected electron beam $EB_{d1}$ which is irradiated on the beam-size adjustment aperture 21 in the second aperture member 15. The beam size of the secondary shaped electron beam $EB_s$ passing through the beam-size adjustment aperture 21 is measured with respect to length and breadth in the similar manner which is described in the case of the above-mentioned variable-shaped electron beam.

Inasmuch as the secondary shaped electron beam $EB_s$ or the cell projected electron beam passing through one of the cell projection apertures 17 extracting a part of the exposure pattern has a complicated shape, it is difficult to correctly measure the beam size of the cell projected electron beam. On the other hand, inasmuch as the secondary shaped electron beam $EB_s$ passing through the beam-size adjustment aperture 21 has a rectangular shape which is similar to that of the above-mentioned variable-shaped electron beam, it is possible to correctly measure the beam size of the secondary shaped electron beam $EB_s$ passing through the beam-size adjustment aperture 21.

The measured beam size on the stage 23 is equal with respect to length and breadth to 1.04 $\mu$m. Therefore, sizes of all apertures on the second aperture 15A are formed due to process on manufacturing the second aperture member 15 to be with respect to length and breadth larger than a design size by one micron.

Finally, a difference or +0.04 μm between the measured value and the design value of the beam size in the electron beam passing through the beam-size adjustment aperture 21 is added to the beam size of the variable-shaped electron beam. It will be assumed as follows. The beam size of the variable-shaped electron beam is represented by a length of H and a width of W. The shape deflector 13 has a correction amount which is represented by dH and dW in length and width, respectively. In this event, the correction amount dH and dW of the shape deflector 13 is generally represented by following beam size correction equations using the length H and the width W of the beam size for the variable-shaped electron beam:

$$dH = a_0 + a_1 \cdot H + a_2 \cdot W + a_3 \cdot H \cdot W,$$

and $$dW = b_0 + b_1 \cdot W + b_2 \cdot H + b_3 \cdot W \cdot H.$$

where $a_0$, $a_1$, $a_2$, and $a_3$ represent coefficients of the length in the correction amount and $b_0$, $b_1$, $b_2$ and $b_3$ represent coefficients of the width in the correction amount.

In the example being illustrated, the above-mentioned difference of +0.04 μm is added to the coefficients $a_0$ and $b_0$ of shift terms in the above-mentioned beam size correction equations for the variable-shaped electron beam. In this event, although a size difference of 0.04 μm occurs in prior art between a resist pattern exposed using the EB cell projection lithography and another resist pattern exposed using the variable-shaped electron-beam exposure, the size difference between the both resist patterns is canceled using a method according to the present invention. As a result, it is possible to improve a precision of the size in the resist pattern from 0.07 μm(3σ) in prior art to 0.03 μm(3σ) in the present invention.

Figure 4:
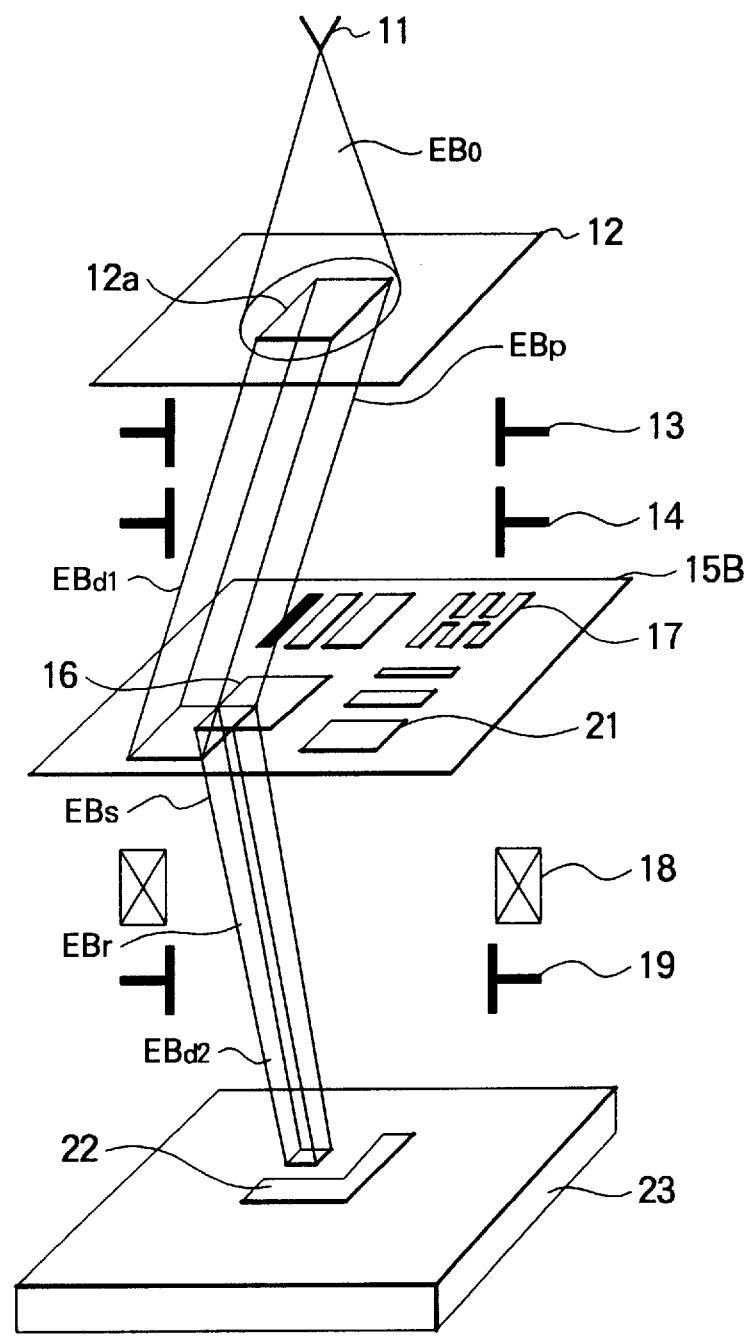
FIG. 4 is a schematic vertical sectional perspective view of an electron-beam writing system according to a second embodiment of this invention.
Figure 5:
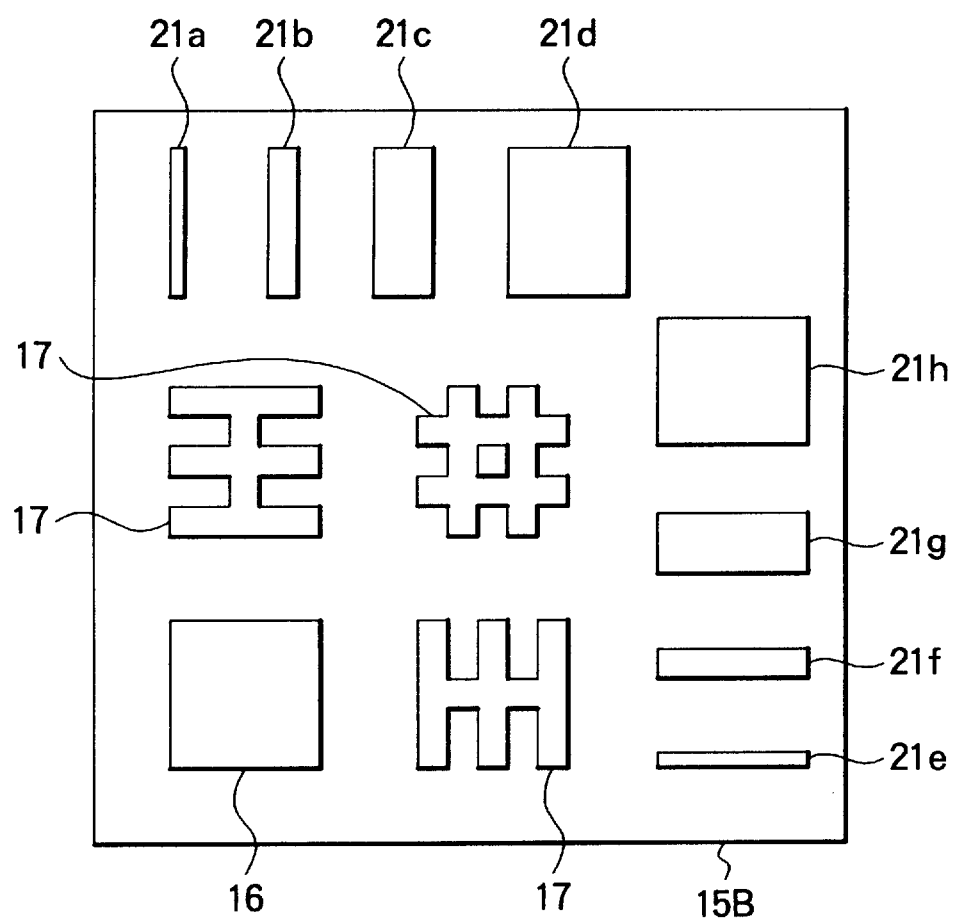
FIG. 5 is a plan view of a second aperture member for use in the electron-beam writing system illustrated in FIG. 4.

Referring to FIGS. 4 and 5 an electron-beam writing system according to a second embodiment of this invention comprises similar parts designated by like reference numerals in those illustrated in FIGS. 2 and 3. Like in FIGS. 2 and 3, the illustrated electron-beam writing system comprises the electron gun 11, the first aperture member 12, the shape deflector 13, the selection deflector 14, a second aperture member 15B, the reduction lens 18, and the deflector 19. In the example being illustrated, the second aperture member 15B is similar in structure to the second aperture member 15A illustrated in FIGS. 2 and 3 except that the second aperture member 15B has a plurality of beam-size adjustment apertures 21a, 21b, 21c, 21d, 21e, 21f, 21g, and 21h while the second aperture member 15A has only one beam-size adjustment aperture 21. For the purpose of distinction, the beam-size adjustment apertures 21a through 21h are called first through eighth beam-size adjustment apertures, respectively.

In the example being illustrated, the first through the fourth beam-size adjustment apertures 21a, 21b, 21c, and 21d have the same vertical size of 125 μm while the fifth through the eighth beam-size adjustment apertures 21e, 21f, 21g, and 21h have the same transverse size of 125 μm. The first through the fourth beam-size adjustment apertures 21a, 21b, 21c, and 21d have transverse size of 12.5 μm, 25 μm, 50 μm, and 100 μm, respectively. The fifth through the eighth beam-size adjustment apertures 21e, 21f, 21g, and 21h have vertical size of 12.5 μm, 25 μm, 50 μm, and 100 μm, respectively.

Inasmuch as the secondary shaped electron beam $EB_s$ passing through the second aperture member 15 is reduced by the reduction lens 18 into the reduced electron beam $ER_r$ having the size which is one twenty-fifths of that of the secondary shaped electron beam $EB_s$, the secondary shaped electron beam $EB_s$ passing through the first through the fourth beam-size adjustment apertures 21a to 21d are reduced by the reduction lens 18 into the reduced electron beams $ER_r$ which have sizes of (5×0.5)μm, (5×1)μm, (5×2) μm, and (5×4)μm on the stage 23, respectively while the secondary shaped electron beam $EB_s$ passing through the fifth through the eighth beam-size adjustment apertures 21e to 21h are reduced by the reduction lens 18 into the reduced electron beams $ER_r$ which have sizes of (0.5×5) μm, (1×5) μm, (2×5)μm, and (4×5)μm on the stage 23, respectively.

Description will now proceed to adjustment of the beam size. At first, the adjustment of the beam size in the variable-shaped electron beam is carried out in the similar manner which is described in the above-mentioned first embodiment. Subsequently, measurement is made as regard the beam size of the electron beams passing through the first through the eighth beam-size adjustment apertures 21a to 21h.

In the example being illustrated, the electron beams passing through the first through the fourth beamsize adjustment apertures 21a to 21d have measured values of the beam sizes of (4.75×0.475)μm, (4.75×0.95)μm, (4.75×1.9)μm, and (4.75×3.8)μm on the stage 23, respectively while the electron beams passing through the fifth through the eighth beam-size adjustment apertures 2le to 21h have measured values of the beam sizes of (0.475×4.75)μm, (0.95×4.75)μm, (1.9×4.75)μm, and (3.8×4.75)μm on the stage 23, respectively. Therefore, sizes of all apertures on the second aperture 15B are formed with respect to length and breadth smaller than a design size by 5%.

Finally, a difference or −5% between the measured value and the design value of the beam size in the electron beam passing through the first through the eighth beam-size adjustment apertures 21a to 21h is added to the beam size of the variable-shaped electron beam.

As mentioned before, the correction amount dH and dW of the shape deflector 13 is generally represented by the above-mentioned beam size correction equations. Accordingly, the above-mentioned difference of −5% is added to the coefficients $a_1$ and $b_1$ of gain terms in the above-mentioned beam size correction equations for the variable-shaped electron beam. In this event, although a size difference of 5% occurs in prior art between a resist pattern exposed using the EB cell projection lithography and another resist pattern exposed using the variable-shaped electron-beam exposure, the size difference between the both resist patterns is canceled using a method according to the second embodiment of the present invention. As a result, it is possible to improve a precision of the size in the resist pattern from 0.08 μm(3σ) in prior art to 0.03 μm(3σ) in the present invention.

While this invention has thus far been described in conjunction with several preferred embodiments thereof, it will now be readily possible for those skilled in the art to put this invention into practice in various other manner. For example, the number, combination of sizes, and arrangement of the beam-size adjustment apertures are not be restricted to the above-mentioned embodiments and may be freely set as long as the size of the beam-size adjustment aperture is less than the maximum beam size defined by the primary aperture 12a in the first aperture member 12 and irradiation of the electron beam is possible by the selection deflector 14.

In addition, although the difference of the beam size is added to the coefficients of the beam size correction linear equations for the variable-shaped electron beam as the constant shift terms or the gain terms in the above-mentioned embodiments, the difference of the beam size may be added to trapezoidal terms of the coefficients of the linear equation or coefficients of quadratic or higher order equations. Furthermore, although the description is made as the method of correcting the size difference as the coefficients of the correction equations for the variable-shaped electron beam, the size difference may be stored in a table having vertical and transverse sizes of the beam size as parameters and added to the beam size of the variable-shaped electron beam.

What is claimed is:

1. An electron-beam writing system comprising:

an electron gun for radiating an original electron beam along an electron gun axis;

a first aperture member having a primary aperture on which the original electron beam is irradiated, said first aperture member being for shaping the original electron beam into a primary shaped electron beam;

first deflecting means for deflecting the primary shaped electron beam from the electron gun axis to produce a first deflected electron beam;

a second aperture member having a plurality of secondary apertures on a selected one of which the first deflected beam is irradiated, said second aperture member being for shaping the first deflected electron beam into a secondary shaped electron beam, the secondary apertures including at least one rectangular beam-size adjustment aperture having a known design size;

a reduction lens for reducing the secondary shaped electron beam to produce a reduced electron beam; and second deflecting means for deflecting the reduced electron beam to produce a second deflected electron beam which is irradiated on a sample.

2. An electron-beam writing system as claimed in claim 1, wherein the secondary apertures include a plurality of rectangular beam-size adjustment apertures having longitudinal and lateral dimensions either which vary at a constant ratio.

3. An electron-beam writing system as claimed in claim 1, wherein the primary aperture is a rectangular aperture.

4. An electron-beam writing system as claimed in claim 1, wherein the secondary apertures include a variable-shaped aperture and at least one cell projection aperture.

5. An electron-beam writing system as claimed in claim 1, wherein said first deflecting means comprises a shape deflector for use in a variable-shaped electron-beam exposure and a selection deflector for use in an electron-beam cell projection lithography.

6. A second aperture member for use in an electron-beam writing system comprising an electron gun for radiating an original electron beam along an electron gun axis, a first aperture member having a primary aperture on which the original electron beam is irradiated, said first aperture member being for shaping the original electron beam into a primary shaped electron beam, and deflecting means for deflecting the primary shaped electron beam from the electron gun axis to produce a deflected electron beam, said second aperture member having a plurality of secondary apertures on a selected one of which the deflected beam is irradiated, said second aperture member being for shaping the first deflected electron beam into a secondary shaped electron beam, wherein the secondary apertures include at least one rectangular beam-size adjustment aperture having a known design size.

7. A second aperture member as claimed in claim 6, wherein the secondary apertures include a plurality of rectangular beam-size adjustment apertures having longitudinal and lateral dimensions either which vary at a constant ratio.

8. A method of adjusting a variable-shaped beam size for a variable-shaped electron beam passing through a variable-shaped aperture formed in a second aperture member for use in an electron-beam writing system, said second aperture member including at least one rectangular beam-size adjustment aperture having a known design size, said method comprising the steps of:

measuring a beam size of an electron beam passing through the rectangular beam-size adjustment aperture to obtain a measured beam size;

calculating a difference between the measured beam size and the design size; and adding the difference to the variable-shaped beam size.

9. A method as claimed in claim 8, wherein the difference is a constant value independent of the beam size.

10. A method as claimed in claim 8, wherein the difference is an approximate value by a polynomial expression using the beam size as a parameter.

11. A method as claimed in claim 8, wherein the difference is a value indicated by a table using the beam size as a parameter.

* * * * *